US012684808B2

(12) United States Patent (10) Patent No.: US 12,684,808 B2
Omizu et al. (45) Date of Patent: Jul. 14, 2026

(54) SEMICONDUCTOR DEVICE INCLUDING A TRENCH GATE TYPE MOSFET AND METHOD OF MANUFACTURING THE SAME

(71) Applicant: RENESAS ELECTRONICS CORPORATION, Tokyo (JP)

(72) Inventors: Yuto Omizu, Tokyo (JP); Yuya Abiko, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 732 days.

(21) Appl. No.: 18/061,673

(22) Filed: Dec. 5, 2022

(65) Prior Publication Data

US 2023/0299194 A1 Sep. 21, 2023

(30) Foreign Application Priority Data

Mar. 15, 2022 (JP) ................................. 2022-040435

(51) Int. Cl.
        *H10D 30/66* (2025.01)
        *H10D 30/01* (2025.01)
        (Continued)
(52) U.S. Cl.
        CPC ....... *H10D 30/668* (2025.01); *H10D 30/0297* (2025.01); *H10D 62/109* (2025.01);
        (Continued)
(58) Field of Classification Search
        CPC ............. H10D 30/668; H10D 30/0297; H10D 62/109; H10D 64/117; H10D 64/2527;
        (Continued)

(56) References Cited

U.S. PATENT DOCUMENTS 7,679,136 B2    3/2010   Kachi et al.
9,780,205 B2   10/2017   Saito et al.
                 (Continued)

FOREIGN PATENT DOCUMENTS

JP        2012-033951 A       2/2012
JP        2013-197551 A       9/2013
                 (Continued)

OTHER PUBLICATIONS

Notice of Reasons for Refusal received in corresponding Japanese Patent Application No. 2022-040435, dated May 7, 2025.

*Primary Examiner* — Mohammad M Hoque
(74) *Attorney, Agent, or Firm* — Rimon P.C.

(57) ABSTRACT

Disclosed is a technique for improving performance of a semiconductor device having a trench gate type power MOSFET. Concretely, a method of manufacturing a semiconductor device having a trench gate type power MOSFET comprising: forming a trench in a semiconductor substrate; introducing both of a p-type impurity (Boron) and carbon (C) into a bottom surface of the trench to form a p-type impurity introduced region; forming a gate electrode to fill the trench; forming a channel forming region and a source region at the side of the trench in which the gate electrode is filled; and subjecting a heat treatment to the p-type impurity introduced region to form an electric field relaxation layer having suppressed crystal defects and a controlled shape.

4 Claims, 22 Drawing Sheets

(51) Int. Cl.

| | | |
|---|---|---|
| *H10D 62/10* | (2025.01) | |
| *H10D 64/00* | (2025.01) | |
| *H10P 30/20* | (2026.01) | |
| *H10P 32/10* | (2026.01) | |
| *H10P 32/14* | (2026.01) | |

(52) U.S. Cl.
CPC ......... *H10D 64/117* (2025.01); *H10P 30/204* (2026.01); *H10P 30/21* (2026.01); *H10P 32/1406* (2026.01); *H10P 32/171* (2026.01)

(58) Field of Classification Search
CPC .. H10D 64/518; H10D 62/107; H10D 62/127; H10D 62/105; H10D 30/665; H10D 62/126; H01L 21/2253; H01L 21/26513; H01L 21/26586
USPC ........................................................ 257/330
See application file for complete search history.

(56) References Cited

U.S. PATENT DOCUMENTS

| | | | | |
|---|---|---|---|---|
| 2009/0283823 | A1* | 11/2009 | Izumi ................... | H10D 30/668 |
| | | | | 438/270 |
| 2013/0248995 | A1* | 9/2013 | Nishiwaki .............. | H10D 30/63 |
| | | | | 257/334 |
| 2014/0248756 | A1* | 9/2014 | Lee ........................ | H10B 69/00 |
| | | | | 438/424 |
| 2016/0329422 | A1* | 11/2016 | Saito .................... | H10D 12/038 |
| 2018/0175149 | A1* | 6/2018 | Takaya ................. | H10D 12/031 |
| 2018/0182886 | A1* | 6/2018 | Kobayashi ........... | H10D 30/668 |
| 2022/0406897 | A1 | 12/2022 | Tanaka et al. | |

FOREIGN PATENT DOCUMENTS

| | | |
|---|---|---|
| JP | 2015-126085 A | 7/2015 |
| JP | 2015-231037 A | 12/2015 |
| WO | 2021/106152 A1 | 6/2021 |

* cited by examiner

SEMICONDUCTOR DEVICE INCLUDING A TRENCH GATE TYPE MOSFET AND METHOD OF MANUFACTURING THE SAME

CROSS-REFERENCE TO RELATED APPLICATIONS

The disclosure of Japanese Patent Application No. 2022-040435 filed on Mar. 15, 2022, including the specification, drawings and abstract is incorporated herein by reference in its entirety.

BACKGROUND OF THE INVENTION

The present invention relates to a method of manufacturing a semiconductor device, and more particularly, to a technique effectively applied to a method of manufacturing a semiconductor device including a trench gate type MOSFET.

A trench gate type MOSFET having a gate electrode in a trench provided in a main surface of a substrate is known as a power MOSFET (Metal Oxide Semiconductor Field Effect Transistor) for which a breakdown voltage is required. Japanese unexamined Patent Application publication No. 2012-33951 discloses a double gate structure in which a gate electrode and a field plate electrode are embedded in a trench as a configuration of a power MOSFET.

SUMMARY OF THE INVENTION

In the trench gate type MOSFET, since the electric field tends to concentrate at the bottom of the trench, the depletion layer hardly spreads sufficiently, which makes it difficult to achieve a high breakdown voltage. On the other hand, in an re-channel MOSFET, there is a method of relaxing an electric field by implanting an impurity such as boron (B) into the bottom of the trench. However, if boron is diffused by the heat treatment after the implantation step, the n-type layers between adjacent trenches become narrower, causing the on-resistance Ron to be increased due to the blockage of the current path, and AC (Alternating Current) property becomes complicated. Since these problems become more pronounced as the cell pitch decreases, it is conceivable to increase the cell pitch as a countermeasure, but in this case, integration of the cells becomes difficult.

Other objects and novel features will become apparent from the description of this specification and the accompanying drawings.

The typical ones of the embodiments disclosed in the present application will be briefly described as follows.

In a method of manufacturing a semiconductor device having a trench gate type MOSFET, a p-type impurity and carbon (C) are introduced into a bottom surface of a trench formed to fill a gate electrode.

In a semiconductor device having a trench gate type MOSFET, a semiconductor region introduced both of a p-type impurity and carbon (C) is formed at a bottom surface of a trench in which a gate electrode is filled.

According to one embodiment, the performance of semiconductor device can be improved.

BRIEF DESCRIPTION OF THE DRAWINGS

Figure 1:
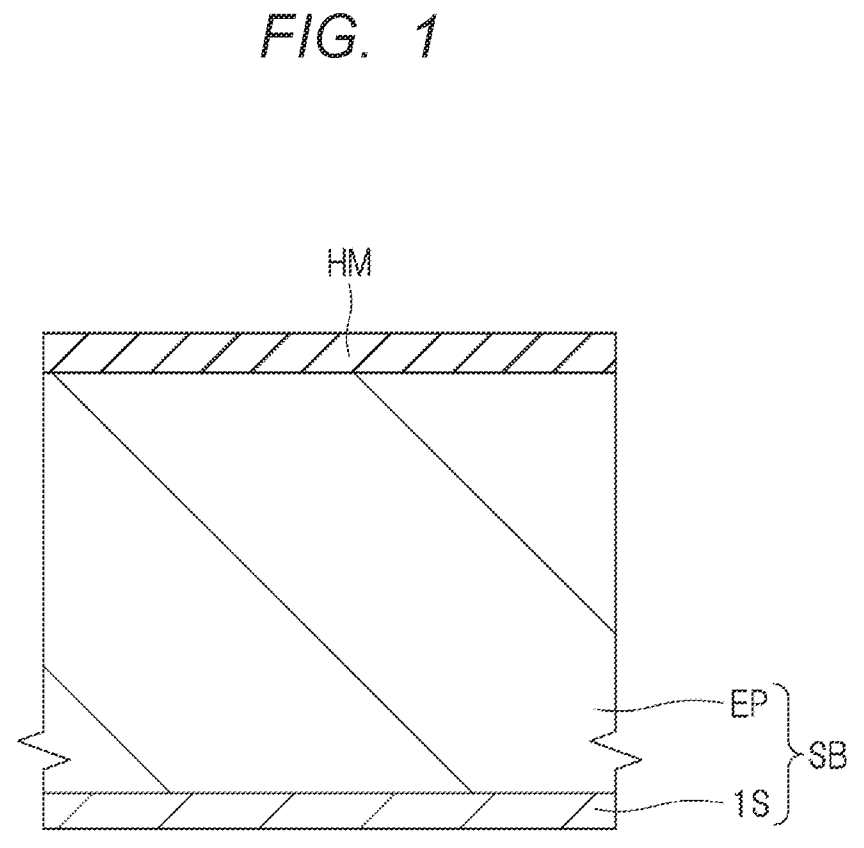

FIG. 1 is a cross-sectional view showing a manufacturing process of a semiconductor device according to one embodiment.

FIG. 2 is a cross-sectional view showing the manufacturing process of the semiconductor device following FIG. 1.

FIG. 7 is a cross-sectional view showing the manufacturing process of the semiconductor device following FIG. 6.

FIG. 10 is a cross-sectional view showing the manufacturing process of the semiconductor device following FIG. 9.

FIG. 11 is a cross-sectional view showing the manufacturing process of the semiconductor device following FIG. 10.

FIG. 22 is a cross-sectional view showing a manufacturing process of a semiconductor device as a comparative example.

DETAILED DESCRIPTION

Figure 3:
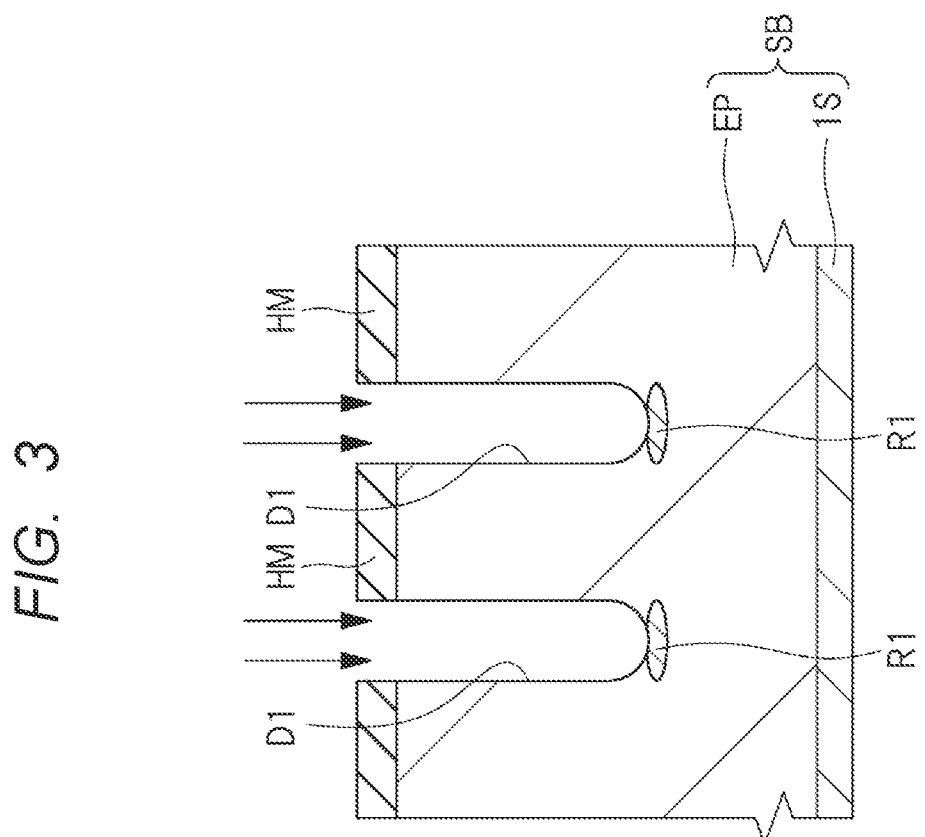
FIG. 3 is a cross-sectional view showing the manufacturing process of the semiconductor device following FIG. 2.

In the following embodiments, when required for convenience, the description will be made by dividing into a plurality of sections or embodiments. But except when specifically stated, they are not independent of each other, and one is a part of the other, or all of the other modifications, or is related to details or supplementary description. In addition, in the following embodiments, the number of elements or the like (including the number, the number, the amount, the range, and the like) is not limited to the mentioned number, except the case where it is specified in particular or the case where it is obviously limited to a specific number in principle, and may be equal to or more than the mentioned number or may be equal to or less than the mentioned number.

Furthermore, in the following embodiments, the constituent elements (including element steps and the like) are not necessarily essential except for the case in which they are specifically specified, the case in which they are considered to be obviously essential in principle, and the like. Similarly, in the following embodiments, when referring to the shapes, positional relationships, and the like of components and the like, it is assumed that the shapes and the like are substantially approximate to or similar to the shapes and the like, except for the case in which they are specifically specified and the case in which they are considered to be obvious in principle, and the like. The same applies to the above numerical values and ranges.

Hereinafter, embodiments will be described in detail based on the drawings. In all the drawings for explaining the embodiments, members having the same functions are denoted by the same reference numerals, and repetitive descriptions thereof are omitted. In the following embodiments, descriptions of the same or similar parts will not be repeated in principle except when particularly necessary.

In addition, "−" and "+" are signs indicating the relative impurity concentration of n-type or p-type conductivity, and for example, when the conductivity type is n-type, the concentration of the n-type impurity increases in the order of "n⁻", "n", "n⁺".

Here, a power MOSFET is exemplified as the semiconductor device of the present application. The power MOSFET is a semiconductor device capable of handling power of several watts or more. The device of the present application has a trench gate type MOSFET from among power MOSFETs. The trench gate power MOSFET includes a gate electrode made of polysilicon or the like in a relatively long narrow trench formed in a main surface (sometimes written as an upper surface or a first main surface) of the semiconductor substrate, and a channel region is formed in the thickness direction of the semiconductor substrate. In this case, in general, the upper surface side of the semiconductor substrate serves as a source region, and the rear surface side (sometimes written as a lower surface side or a second main surface side) serves as a drain region. Hereinafter, a MOSFET (MOS field-effect transistor) will be described. However, the present invention is not limited to the MOSFET, and any MISFET (Metal Insulator Semiconductor Field Effect Transistor) can be used.

In addition, the semiconductor device of the present application has a double-gate type power MOSFET having tow gate electrodes in a trench from among the trench gate power MOSFET. The double-gate type power MOSFET has a field plate electrode (dummy gate electrode) below a gate electrode (intrinsic gate electrode) in the trench. The field plate electrode is an electrode having a function of dispersing a steep potential gradient concentrated in the vicinity of a drain-side end portion of the gate electrode, and is electrically connected to the source electrode.

Figure 22:
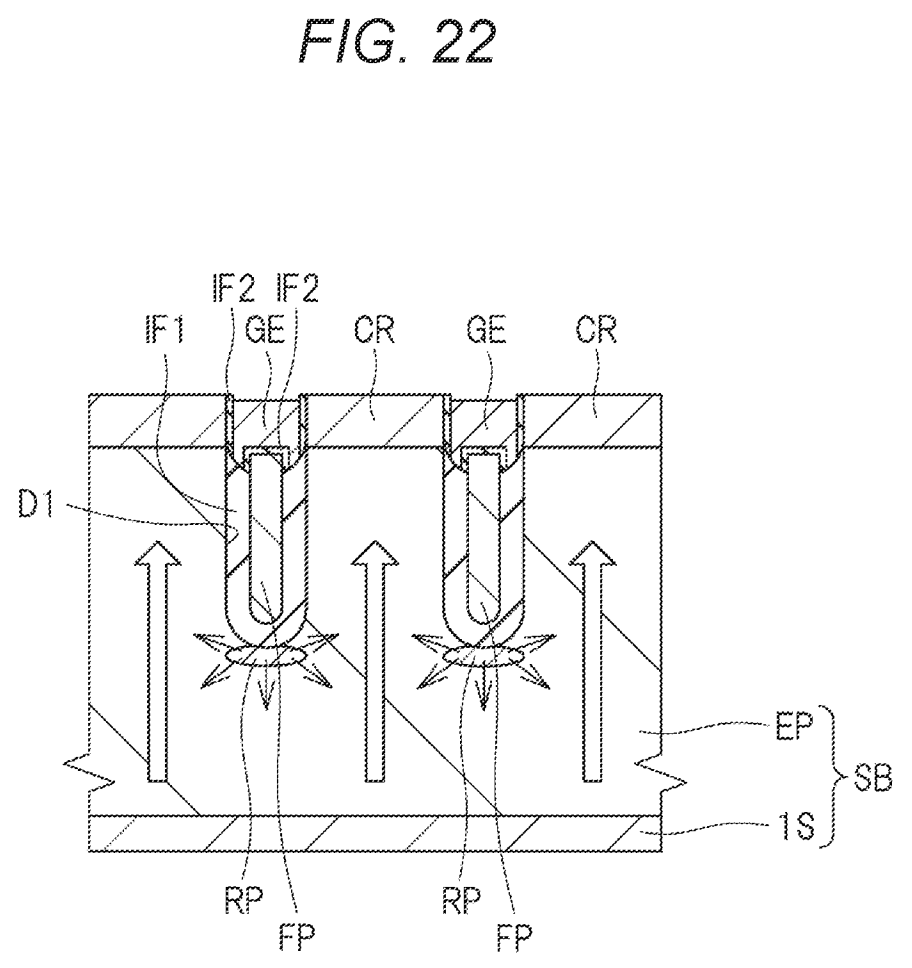

In the following, details of the room for this improvement will be described with reference to the drawings. FIG. 22 is a cross-sectional view of a semiconductor device according to a comparative example showing a manufacturing process. In the comparative example, the manufacturing process of the trench gate power MOSFET will be described.

As shown in FIG. 22, in the manufacturing process of MOSFET of the comparative example, after the n-type semiconductor substrate SB is prepared, a plurality of trenches D1 arranged on the main surface of the substrate are formed. Then, in order to prevent the electric field from concentrating on the bottom of the trench D1 in MOSFET to be the completed, boron (B), which is a p-type impurity, is introduced into the bottom of the trench D1 by using an ion-implantation method. As a result, a p-type semiconductor region RP, which is a region in which a p-type impurity is introduced, is formed in the semiconductor substrate SB near the bottom portion of the trench D1. Next, the field plate electrode FP and the gate electrode GE are formed in the trench D1 via the insulating films IF1, IF2 respectively. Next, a p-type impurity (for example, boron (B)) is implanted into the upper surface of SB. Subsequently, in order to diffuse the p-type dopant introduced into SB by the implantation step, a thermal diffusion treatment (thermal treatment) is performed. This heat diffusing treatment (heat treatment) is performed at 1100° C. for 10 min or more. As a result, a p-type semiconducting region CR, which is a channel-forming region, is formed in the region into which the p-type impurity is introduced. Thus, the structure shown in FIG. 22 is obtained. Thereafter, although not shown, the source regions are formed on the upper surface of the semiconductor substrate SB, and the wires are formed on the semiconductor substrate SB, thereby substantially completing the semiconductor device of the comparative example.

As described the above, in the trench gate type MOSFET, an electric field tends to concentrate at the bottom of the trench, so that the depletion layer is difficult to sufficiently spread. Therefore, it is difficult to increase the breakdown voltage of MOSFET because the drain-source breakdown voltage BVDSS of MOSFET is low.

In the semiconductor device of the comparative example, the p-type impurity is introduced into the bottom portion of the trench D1, thereby enabling MOSFET to have a high breakdown voltage. However, when the thermal diffusion treatment is performed to form the semiconductor region CR which is the channel-forming region, it is conceivable that the p-type impurity (for example, boron (B)) introduced into the bottom of the trench D1 diffuses as indicated by a black arrow in FIG. 22. Then, the n-type layers (drift layers) between the adjacent trench D1 are narrowed, and the on-resistance Ron is increased due to the blockage of the current path indicated by the white arrow in FIG. 22. In addition, when the on-resistance Ron is increased, the on-resistance during AC operation of MOSFET becomes higher than that during DC (Direct Current) operation, and AC property becomes complicated, that is, the switching property fluctuates. These issues become more pronounced as the cell pitch of MOSFET decreases. In other words, as the distance between the trench D1 decreases, the on-resistance increases. Therefore, as a countermeasure, it is conceivable to secure a current path by increasing the cell pitch, but in this case, integration of the cell becomes difficult, which hinders miniaturization of the semiconductor device.

As described above, in a MOSFET of introducing an impurity for electric field relaxation into a bottom portion of a trench for filling a gate, there is room for improvement to be solved.

Therefore, in the following embodiments, contrivance is made to solve the above-described room for improvement. Hereinafter, the technical idea in the present embodiment to which the devise is applied will be described.

A method of manufacturing a semiconductor device according to the present embodiment will be described below with reference to FIGS. 1 to 13.

First, as shown in FIG. 1, a semiconductor substrate SB (at this stage, a semiconductor wafer having a planar circular shape) in which an epitaxial layer (semiconductor layer) EP made of a high-resistance n-type silicon (Si) single crystal is grown on a substrate 1S made of a low-resistance n$^+$ type silicon (Si) single crystal is prepared. The semiconductor-substrate SB includes a main surface (first main surface) and a back surface (second main surface) opposite to the main surface. Subsequently, an insulating film HM made of, for example, silicon oxide is formed on the main surface of the semiconductor-substrate SB (the upper surface of the epitaxial-layer EP). Here, a silicon oxide film is used as the insulating film HM, but other materials such as silicon nitride (Si$_3$N$_4$) or the like may be used.

Figure 2:
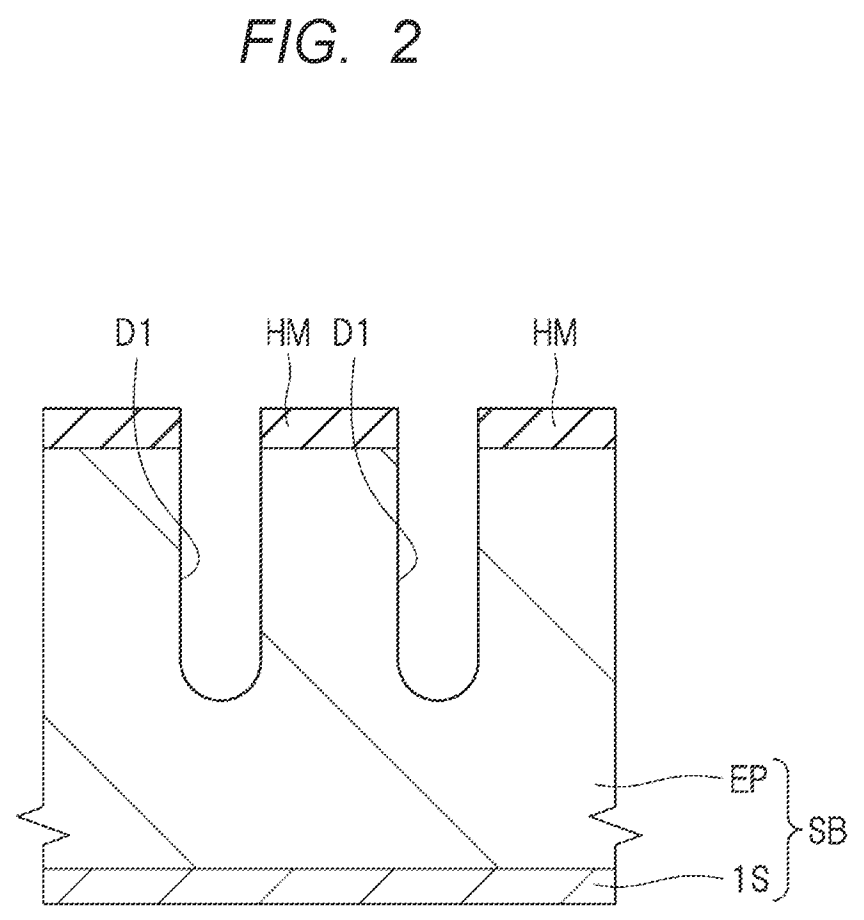

Next, as shown in FIG. 2, a resist pattern is formed on the insulating film HM through a series of photolithography processes such as coating, exposure, and development of a photoresist (hereinafter, simply referred to as a resist) film. Thereafter, the insulating film HM is etched using the resist pattern as an etching mask, and the resist pattern is removed to form a pattern of the insulating film HM for forming the trench on the main surface of SB. The patterned insulating film HM functions as a hard mask film for forming trenches.

Subsequently, using the pattern of the insulating film HM as an etching mask, the semiconductor-substrate SB is etched by anisotropic dry etching to form a plurality of trench D1. Each of the plurality of trench D1 does not reach the board 1S and reaches an intermediate depth of the epitaxial layers EP.

Next, as shown in FIG. 3, using the insulating film HM as an ion implantation blocking mask, carbon © and boron (B), which are p-type impurities, are implanted into the bottom portions of the trench D1 by an ion implantation method. As a result, a p-type semiconductor area R1 in which boron and carbon are introduced is formed in the epitaxial layers EP near the bottom surface of the trench D1 (in the semiconductor board SB). Here, the semiconducting region R1 is formed by implanting boron and carbon into the same region.

In this implantation step, boron and carbon are implanted in separate steps. Boron and carbon may be implanted first. The energy of boron here is 10 keV and the dose is $1.0 \times 10^{13}$ cm$^{-2}$. In addition, the carbon-implanted energy is 12 keV and the dose is $5.0 \times 10^{15} \sim 5.0 \times 10^{16}$ cm$^{-2}$. These values vary depending on the target breakdown voltage of the device, the impurity concentration of the epitaxial layer, the through film thickness, and the like. The semiconductor-region R1 has a crystal-defect due to the introduction of carbon.

Figure 4:
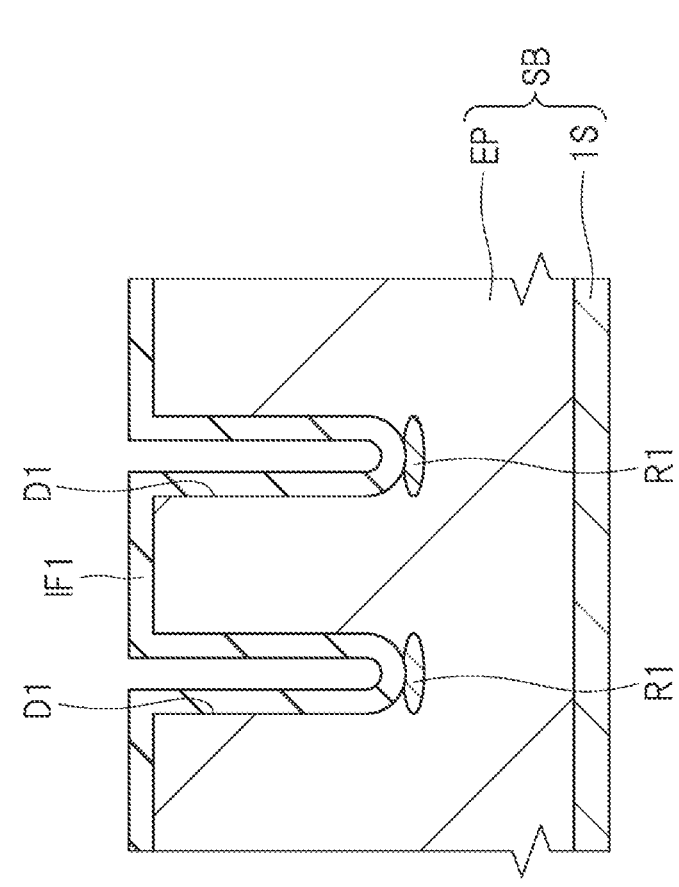
FIG. 4 is a cross-sectional view showing the manufacturing process of the semiconductor device following FIG. 3.

Next, as shown in FIG. 4, the insulating film HM is removed to expose the main surface of the semiconductor substrate SB (i.e., the semiconductor wafer). Thereafter, the semiconductor substrate SB is subjected to a thermal oxidation treatment to form an insulating film IF1 made of, for example, silicon oxide on the main surface of the semiconductor substrate SB including the inner surface of the trench D1. The thickness of the insulating film IF1 is, for example, about 200 nm.

Figure 5:
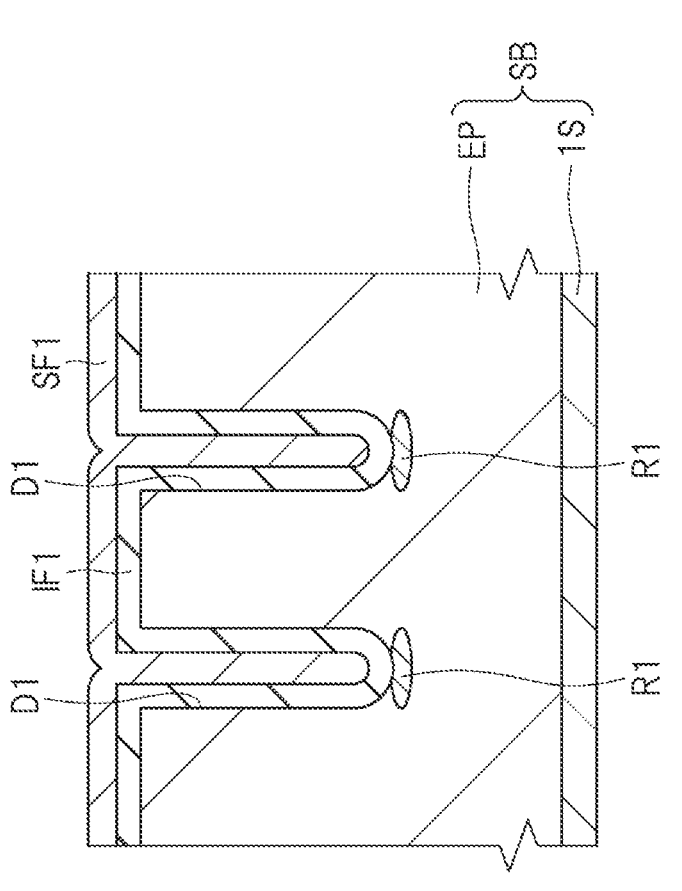
FIG. 5 is a cross-sectional view showing the manufacturing process of the semiconductor device following FIG. 4.

Next, as shown in FIG. 5, a conductive film SF1 made of, for example, low-resistance polycrystalline silicon is deposited on the insulating film IF1 on the main surface of the semiconductor-substrate SB by CVD (Chemical Vapor Deposition method. Thus, the conductive film SF1 is buried in the trench D1. In the conductive film SF1, an impurity (e.g., phosphorus (P), boron (B), arsenic (As), or antimony (Sb)) which acts as a dopant for silicon is introduced to reduce the resistor.

Figure 6:
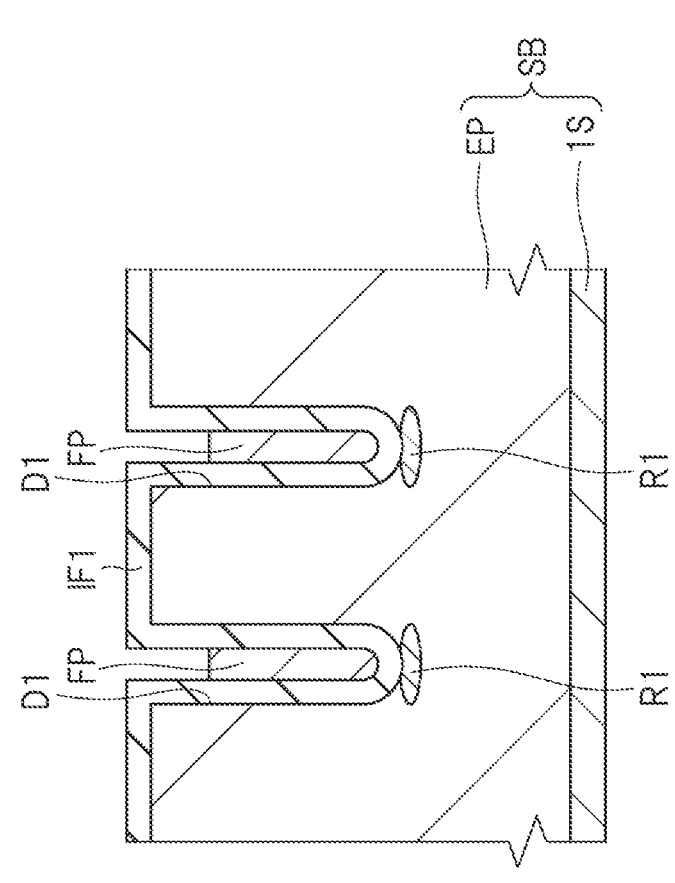
FIG. 6 is a cross-sectional view showing the manufacturing process of the semiconductor device following FIG. 5.

Next, as shown in FIG. 6, a portion of the conductive film SF1 is etched to expose the insulating film SB on the main surface of the semiconductor-substrate IF1, and the upper surface of the conductive film SF1 in the trench D1 is retreated to an intermediate depth of the trench D1. As a result, a field plate electrode (dummy gate electrode) FP made of the conductive film SF1 left in the trench D1 is formed.

Figure 7:
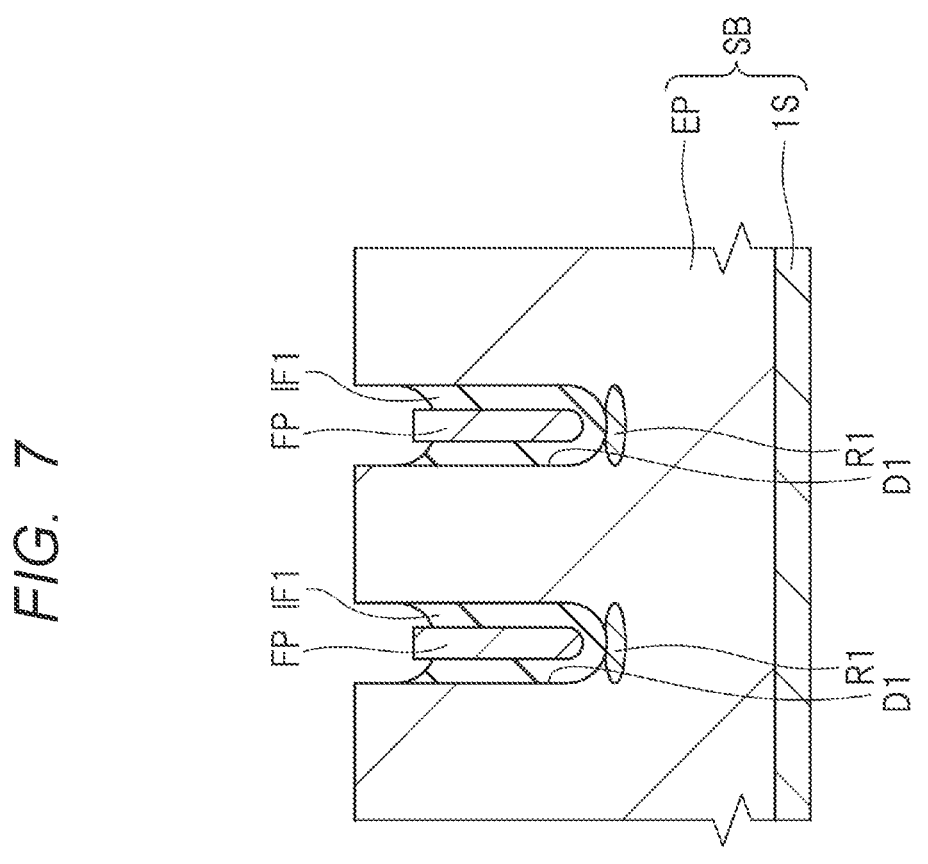

Next, as shown in FIG. 7, the insulating film IF1 exposed from the field plate electrode FP is removed by an etching method to expose the main surface of the semiconductor-substrate SB and a part of the side surface of the trench D1. As a result, the gate insulating film of the field plate electrode FP functions as the field plate electrode IF1 remaining between the trench D1 and the field plate electrode FP.

Figure 8:
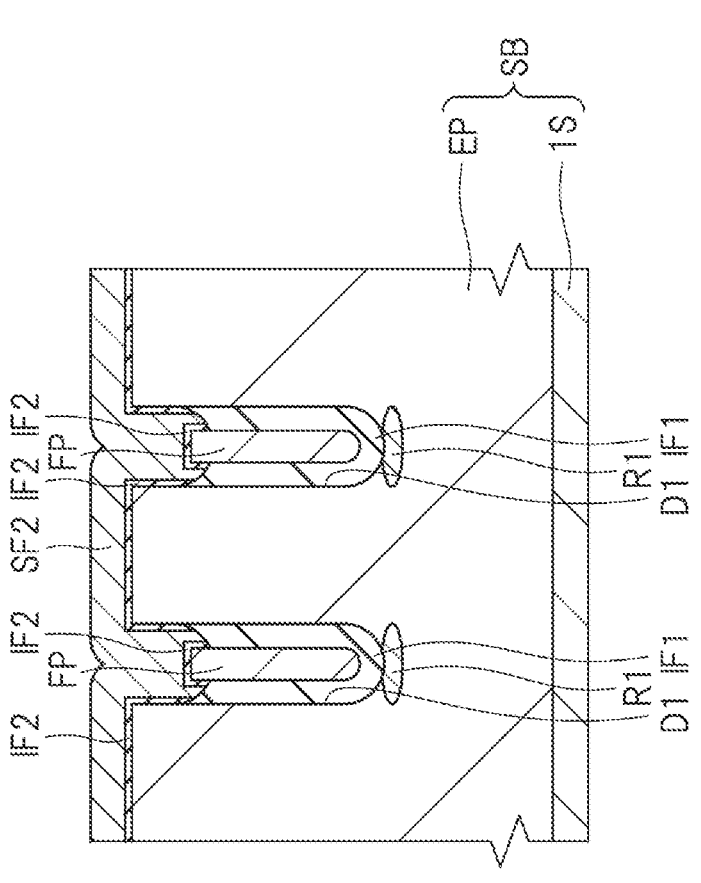
FIG. 8 is a cross-sectional view showing the manufacturing process of the semiconductor device following FIG. 7.

Next, as shown in FIG. 8, the semiconductor substrate SB is subjected to thermal oxidation treatment to form an insulating film IF2, which is a gate insulating film made of a silicon oxide film, on the main surface of the semiconductor substrate SB including the side surface of the trench D1. The insulating film IF2 is formed not only on the surface of the epitaxial layers EP but also on the surface of the exposed field plate electrodes FP. Here, the insulating film IF2 is formed to have a thickness smaller than that of the insulating film IF1. This is because the current driving capability of MOSFET is improved and the on-resistance is lowered. The thickness of the insulating film IF2 is, for example, about 50 nm.

Subsequently, a conductive film SF2 made of, for example, low-resistance polycrystalline silicon is deposited on the insulating film IF1, IF2 on the main surface of the semiconductor-substrate SB including the trench D1 by a CVD method. As a result, the conductive film SF2 is buried in the upper portion of the trench D1. In the conductive film SF2, the same impurities as those in the conductive film SF1 are introduced and the resistor thereof is lowered.

Figure 9:
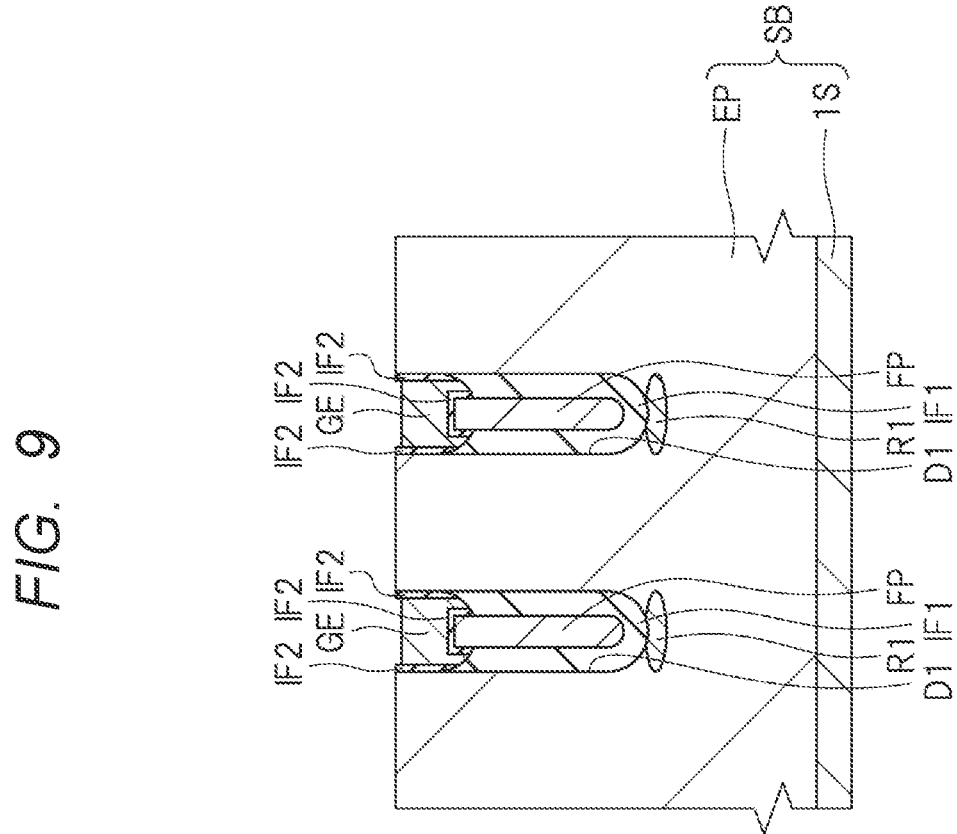
FIG. 9 is a cross-sectional view showing the manufacturing process of the semiconductor device following FIG. 8.

Next, as shown in FIG. 9, the conductive film SF2 and the insulating film IF2 are etched back by an anisotropic dry-etching method to expose the main surface of the semiconductor-substrate SB. Thus, the gate-electrode GE formed of the conductive film SF2 remaining in the trench D1 is formed. The upper surface of the gate-electrode GE is recessed more than the main surface of the semiconductor-substrate SB.

Figure 10:
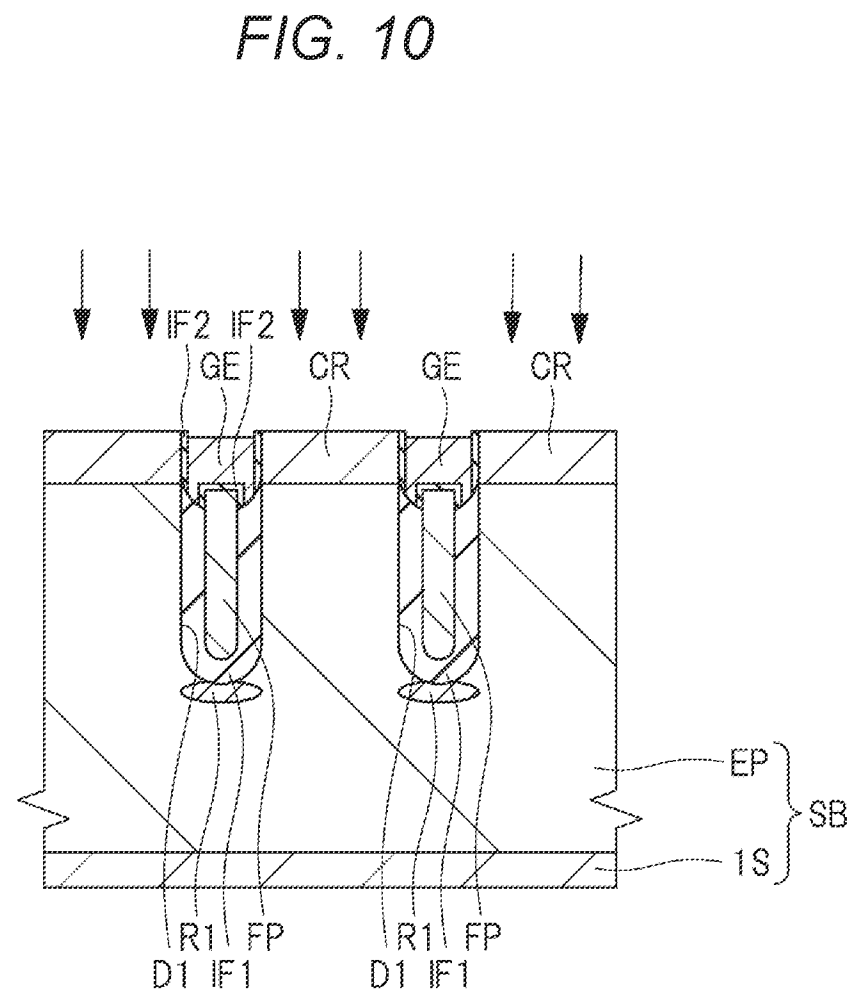

Next, as shown in FIG. 10, a p-type impurity such as boron (B) is introduced into the main surface of the semiconductor-substrate SB by ion-implantation. Thereafter, a p-type semiconductor area CR for forming channels is formed by thermally diffusing the semiconductor board SB. That is, the semiconductor regions CR are formed in the semiconductor board SB in contact with the side surfaces of the trench D1 between the adjacent trench D1. This heat diffusing treatment (heat treatment) is performed at 1100° C. for 10 min or more. Specifically, the heat-diffusing treatment is 30 min performed at 1100° C.

By forming the semiconductor-region CR after the gate oxidation step, it is possible to prevent the surface-segregation during the gate oxidation step (silicon oxidation) from being affected. In particular, when the n-channel type MOSFET (boron (B) is used as the impurity of the channel), the impurity concentration tends to fluctuate due to the surface-segregation, so that it is preferable to form the semiconductor-region CR for forming the channel after the gate-oxidation step. The depth of the semiconductor-region CR is shallower than the depth of the trench D1, and is equivalent to the depth of the gate-electrode GE, for example.

Figure 11:
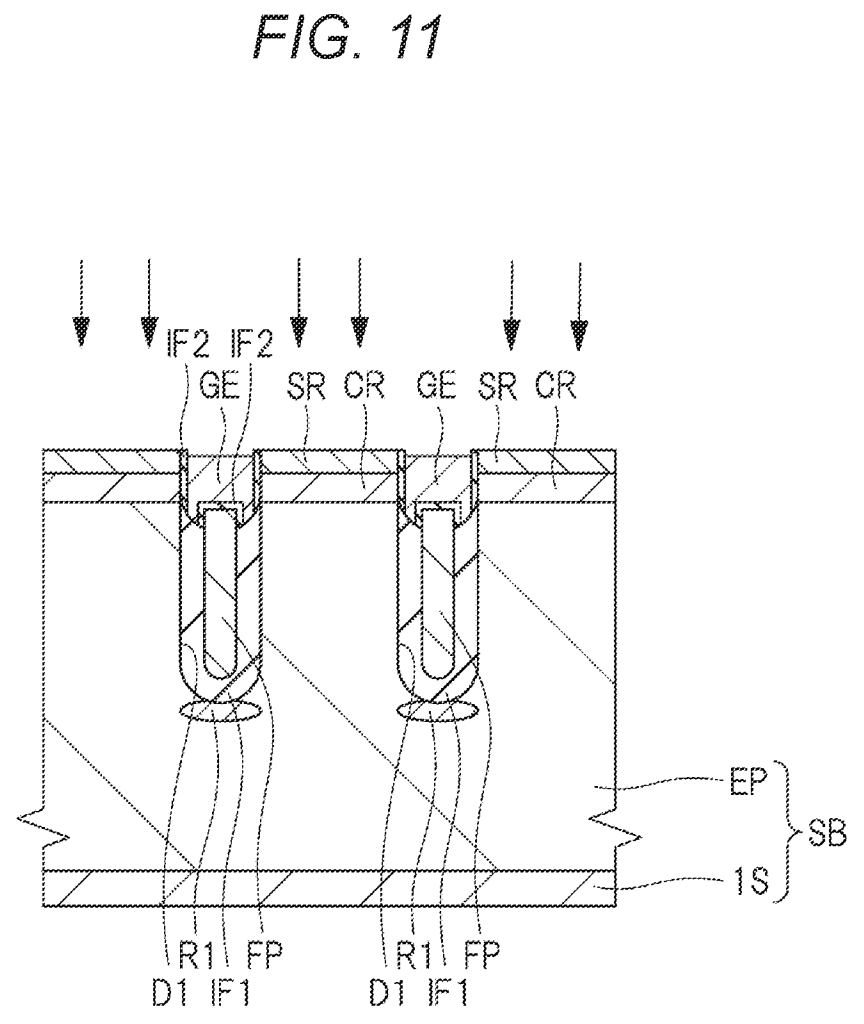

Next, as shown in FIG. 11, a p-type impurity such as phosphorus (P) or arsenic (As) is introduced into the main surface of the semiconductor-substrate SB by ion-implantation. Thereafter, the semiconductor board SB is subjected to a thermal diffusion treatment to form a source region SR which is a n⁺ type semiconductor region. Each of the semiconductor region CR and the source region SR is formed in the semiconductor substrate SB from the main surface of the semiconductor substrate SB to the interme- diate depth of the semiconductor substrate SB in contact with the side surface of the trench D1. The depth of the source-region SR is shallower than the depth of the semi- conductor-region CR.

Figure 12:
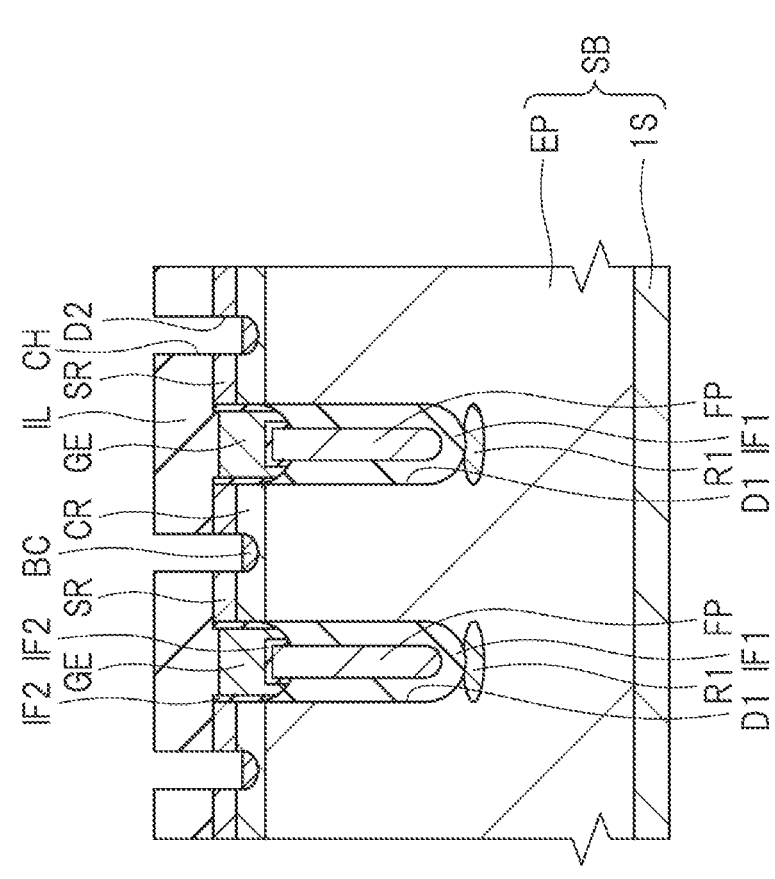
FIG. 12 is a cross-sectional view showing the manufacturing process of the semiconductor device following FIG. 11.

Next, as shown in FIG. 12, an interlayer insulating film IL made of, for example, silicon oxide is deposited on the main surface of the semiconductor-substrate SB, and then a resist pattern in which contact-hole forming regions are exposed on the interlayer insulating film IL is formed by the above- described photolithography process. Subsequently, the inter- layer insulating film IL is etched using the resist pattern in which the contact hole forming regions are exposed as an etching mask, and then the resist pattern is removed to form a contact hole CH on the interlayer insulating film IL. Thereafter, the interlayer insulating film IL is used as an etching mask, and a portion of the semiconductor-substrate SB (the upper surface of the epitaxial layer EP) exposed therefrom is etched to form a trench D2. The trench D2 penetrates through the source-region SR and terminates at an intermediate depth of the channel-forming semiconductor- region CR. Thereafter, a p-type impurity such as boron is introduced into the semiconductor board SB at the bottom of the trench D2 by an ion-implantation method or the like to form the p-type semiconductor regions BC.

Figure 13:
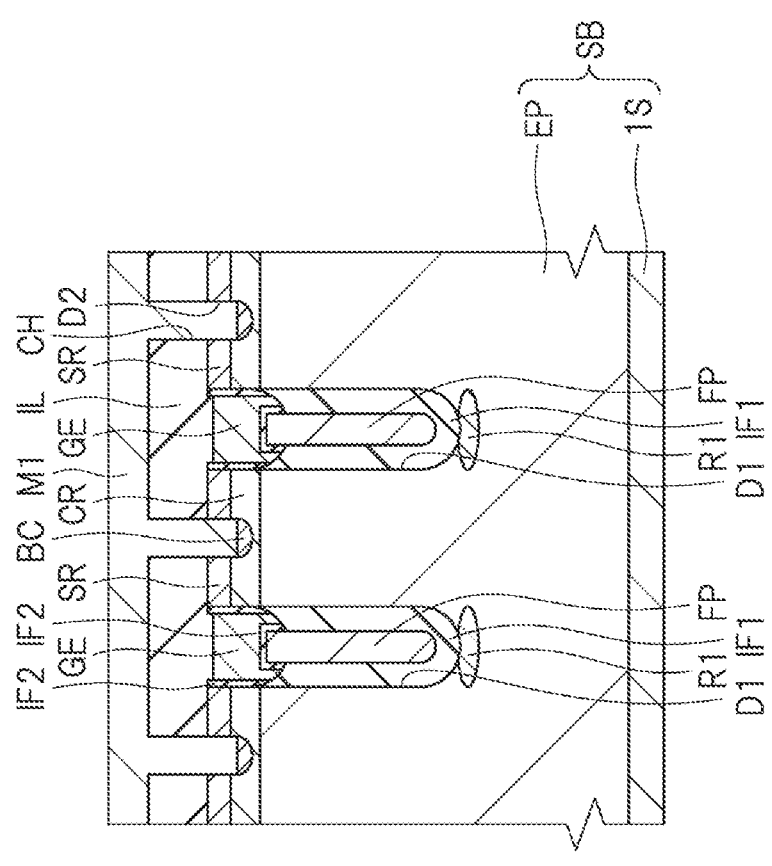
FIG. 13 is a cross-sectional view showing the manufacturing process of the semiconductor device following FIG. 12.

Next, as shown in FIG. 13, a conductive film Ml is formed on the main surface of the semiconductor-substrate SB by, for example, a sputtering method. The conductive film Ml covers the upper surface of the interlayer insulating film IL and fills the inside of the contact hole CH. The conductive film Ml embedded in the contact hole CH constitutes a conductive connecting portion. The conductive film Ml on the interlayer insulating film IL constitutes, for example, a source pad. That is, the source pad is electrically connected to the source area SR via the conductive connecting portion in the contact hole CH.

The source pad is electrically connected to the semicon- ductor region CR via the conductive connecting portion and the semiconductor region BC in the contact hole CH. Further, in regions (not shown), the source pads are electri- cally connected to the field plate electrodes FP via conduc- tive contacts in the contact hole CH. Further, in a region (not shown), a gate pad made of a conductive film Ml separated from the source pad is formed, and the gate pad is electri- cally connected to the gate electrode GE via a conductive connecting portion in the contact hole CH.

Here, n⁺ type substrate 1S, that is, the bottom of the semiconductor substrate SB, constitutes a drain-region. The source region SR, the gate electrode GE, the semiconductor region CR which is a channel forming region, and the drain region (substrate 1S) constitute an n-channel type MOSFET. MOSFET of the present embodiment is an in-trench double- gate power MOSFET having a field-plate electrode FP and a gate electrode GE in a trench D1.

After that, a plurality of singulated semiconductor chips are obtained by forming a drain electrode made of a metallic film covering the bottom surface of the substrate 1S and then cutting the semiconductor wafer by a dicing process. Thus, the semiconductor device of the present embodiment is substantially completed.

The semiconductor device of the present embodiment includes a semiconductor substrate SB including a n⁺ type substrate 1S and an epitaxial layer EP which is an n-type semiconductor layer on the substrate 1S. A plurality of trench D1 are arranged side by side on the main surface of the semiconductor-substrate SB. In the semiconductor sub- strate SB between the adjacent trench D1, a p-type semi- conductor region CR which is a channel-forming region is formed, and a n⁺ type source region SR is formed from the main surface of the semiconductor substrate SB to the upper surface of the semiconductor region CR.

At a position spaced apart from the groove D1, a groove SB shallower than the groove D2 is formed on a main surface between adjacent groove D1. A p⁺ type semicon- ductor region BC is formed in the semiconductor region CR at the bottom of the trench D2. In the trench D1 via the insulating film IF1, the field plate electrode FP is formed, and in the trench D1 on the field plate electrode, the gate electrode GE is formed via the insulating film IF2. The gate electrode GE is insulated from the semiconductor-substrate SB and the field-plate electrode FP by the insulating film IF2. An interlayer insulating film IL is formed on SB. In the interlayer insulating film IL, a contact hole CH, which is a through hole, is formed directly above the trench D2. A conductive film Ml is formed on the interlayer insulating film IL in the contact hole CH and in the trench D2.

The n⁺ type substrate 1S constitutes a drain-region. The source region SR, the gate electrode GE, the semiconductor region CR which is a channel forming region, and the drain region (substrate 1S) constitute an n-channel type MOSFET. The epitaxial layer EP constitutes a drifting layer.

At the bottom of the trench D1, interstitial defects exist in the epitaxial layers EP at carbon-implanted locations. As a result, the p-type impurity in the epitaxial layers EP can be prevented from diffusing.

Figure 14:
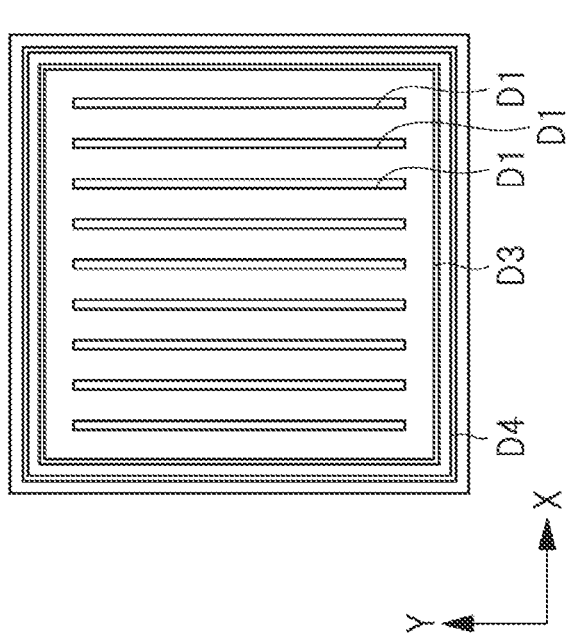
FIG. 14 is a schematic planar layout showing the semiconductor device according to the one embodiment.

Here, FIG. 14 shows a planar layout of a semiconductor chip that is the semiconductor device of the present embodi- ment. In FIG. 14, the trench D1 in the semiconductor chip, the trench D3 formed in the outer periphery of the cell area, and the trench D4 along the outer periphery of the semi- conductor chip are illustrated. As shown in FIG. 14, in the cell area, the trench D1 extends in the Y-direction along the upper surface of the board. The plurality of trenches D1 are arranged in the X-direction along the upper surface of the board. The X direction and the Y direction are orthogonal to each other in plan view. The trench D1 is a cell trench and the trench D3, D4 is a peripheral trench. The trench D2 (see FIG. 13), which is a cell trench, extends in the Y direction between the trench D1 adjacent to each other in the X direction. Gate electrodes GE and field plate electrodes are formed in the respective groove D1 along the shapes of the groove D1. In other words, the gate-electrode GE is arranged in a stripe-like manner in a plan view.

The trench D3 constitutes a termination ring, and a conductive film is formed in the trench D3 via, for example, an insulating film. The groove D4 surrounding the groove D3 in a plan view constitutes a seal ring and has the same structure as the termination ring.

Although the n-channel type MOSFET has been described here, the semiconductor device of the present embodiment described below can be obtained even in a p-channel type MOSFET in which the conductivity types of the semiconductor regions are inverted. For a p-channel MOSFET, the impurity introduced into the bottom of the trench D1 described with reference to FIG. 3 is, for example, p (phosphorus) which is an n-type impurity.

As one of the main features of the present embodiment, a p-type impurity and carbon are implanted into the bottom of the trench D1 to form the semiconductor region R1 after the trench D1 is formed and prior to the heat treatment for forming the semiconductor region CR. By introducing a p-type impurity (in this case, boron (B)) into the bottom portion of the trench D1, electric field relaxation at the bottom portion of the trench D1 in the completed MOSFET can be realized, whereby the breakdown voltage of the device can be ensured.

Here, by introducing not only the p-type impurity but also the carbon into the bottom of the trench D1, the thermal diffusion of the p-type impurity (p-type ion) contained in the semiconductor region R1 is prevented by the heat treatment performed in the step after the formation of the semiconductor region R1. This is considered to be because, due to the introduction of carbon, interstitial defects occur in the semiconductor-substrate SB, and these defects hinder the migration of p-type impurities. Here, the heat treatment is, for example, a heat treatment for forming the semiconductor-region CR or a heat treatment for forming the source-region SR.

By preventing the p-type impurity from diffusing, the n-type layer (drifting layer) between adjacent trench D1 is prevented from narrowing. That is, the current path of MOSFET is prevented from being blocked, and the on-resistance Ron is prevented from increasing. Therefore, the problem that the on-resistance during AC operation becomes higher than that during DC operation due to the increased on-resistance Ron and the problem that AC characteristic becomes complicated are prevented from occurring.

Therefore, since it is not necessary to increase the cell pitch in order to secure the current path, the cell can be integrated, and the semiconductor device can be miniaturized. Therefore, the above-described room for improvement can be eliminated, and the performance of the semiconductor device can be improved.

Figure 15:
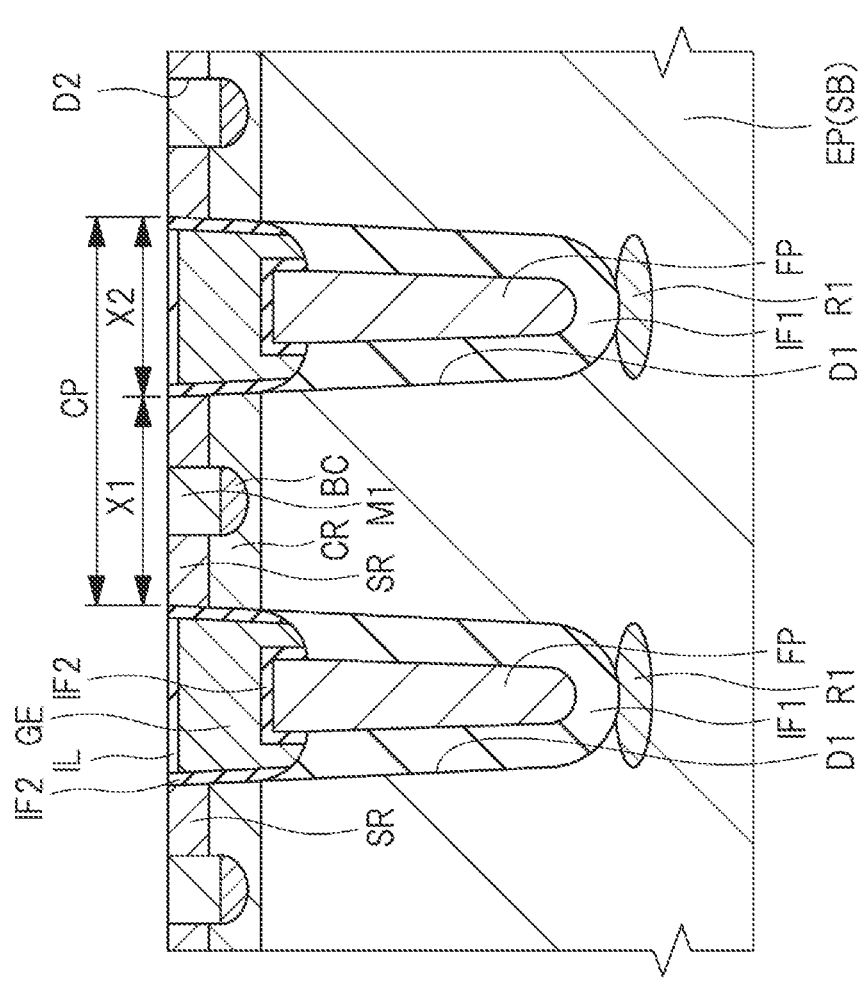
FIG. 15 is an enlarged cross-sectional view showing the semiconductor device according to the one embodiment.

FIG. 15 is an enlarged cross-sectional view of the semiconductor device of the present embodiment. As shown in FIG. 15, it is conceivable that the trench D1 has a taper with respect to the main surface of the semiconductor-substrate SB, and is widened from the bottom toward the upper end (opening). As used herein, the term "cell pitch" refers to a period of a plurality of cell structures repeatedly arranged in a cell region of a semiconductor chip. Specifically, the cell pitch CP shown in FIG. is a distance obtained by adding the opening width D1 in the X direction to the width X1 which is the shortest distance between the adjacent groove D1 (mesa portion) in the X direction (the lateral direction of the groove D1). In other words, the cell pitch CP refers to the shortest distance from one end of the opening portion of the groove D1 to another groove D1 adjacent to the groove D1 on the end side opposite to the end portion in the X direction.

Although the p-type impurity and carbon are implanted into the bottom of the trench D1 of the cell region, the p-type impurity and carbon may be implanted not only into the cell region but also into the trench D3, D4 which is the outer peripheral trench shown in FIG. 14. In addition, p-type impurities and carbon may be implanted only at the bottom of the trench D3 or D4, and p-type impurities and carbon may not be implanted at the bottom of the trench D1 of the cell region, whereby the breakdown voltage of the outer periphery of the cell region may be increased and the breakdown voltage of the cell region may be lower than the outer periphery.

Figure 16:
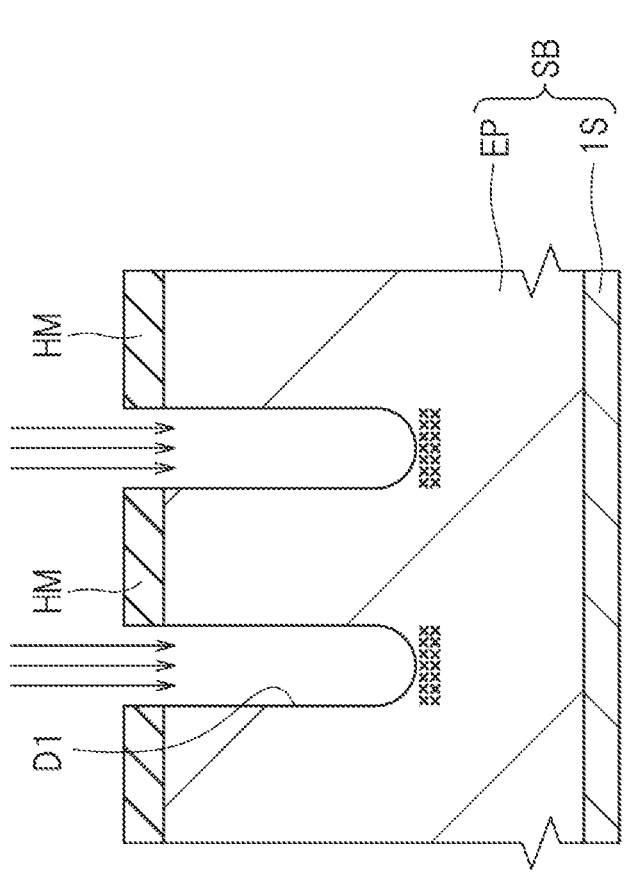
FIG. 16 is a cross-sectional view showing a manufacturing process of a semiconductor device according to a first modification of the one embodiment.
Figure 17:
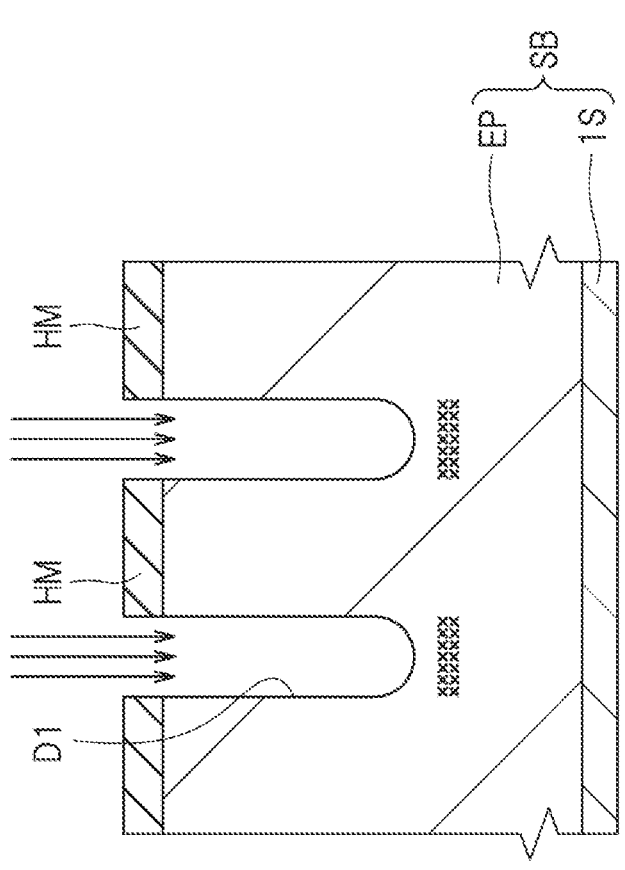
FIG. 17 is a cross-sectional view showing the manufacturing process of the semiconductor device according to the first modification of the one embodiment.

In the above first embodiment, it has been described that carbon is implanted in a region where a p-type impurity is implanted at a bottom portion of a trench in which a gate electrode is to be implanted. The carbon implantation region preferably overlaps the p-type impurity implantation region. FIG. 16 to FIG. 17 show enlarged cross-sectional views showing a manufacturing process of a semiconductor device of a first modification embodiment. In these figures, a cross mark (×) is shown at a point where a defect is caused by the implantation of carbon. Here, the region where the carbon-implanted defects are generated is also a region where the p-type impurities are implanted to form the semiconductor-region R1 (refer to FIG. 13).

As shown in FIGS. 16 and 17, the position at which carbon is implanted can be appropriately changed depending on the injection energy of carbon. FIG. 16 shows a case where the implantation energy is small and FIG. 17 shows a case where the implantation energy is large with respect to the ion implantation process in which the implantation angle is 0 degrees.

Figure 18:
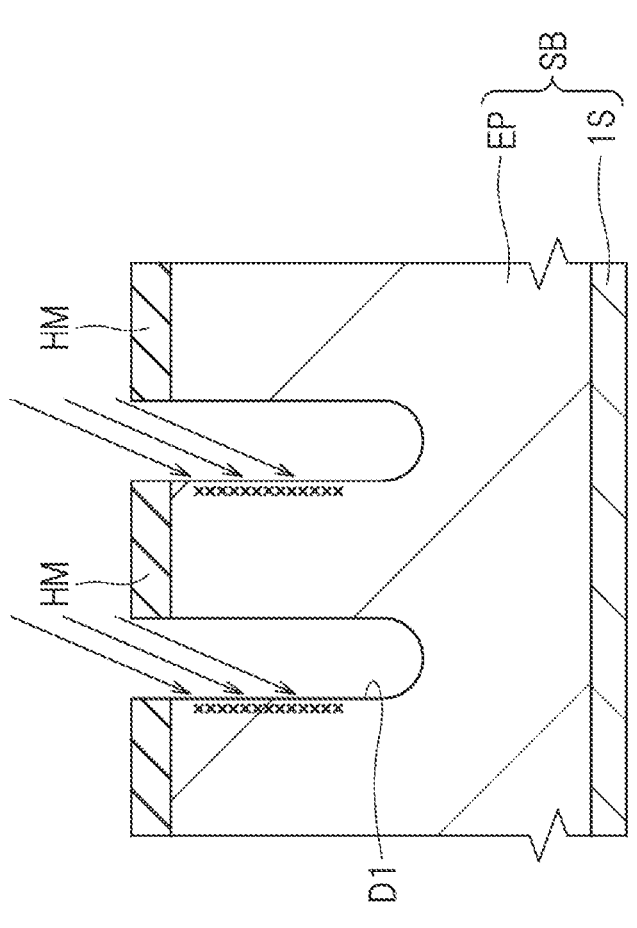
FIG. 18 is a cross-sectional view showing the manufacturing process of the semiconductor device according to the first modification of the one embodiment.
Figure 19:
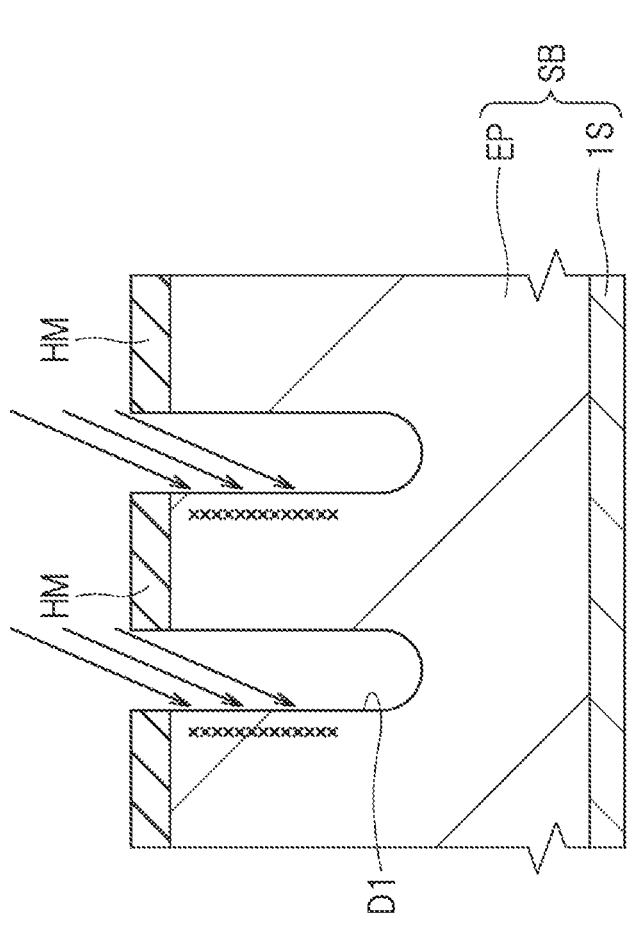
FIG. 19 is a cross-sectional view showing the manufacturing process of the semiconductor device according to the first modification of the one embodiment.
Figure 20:
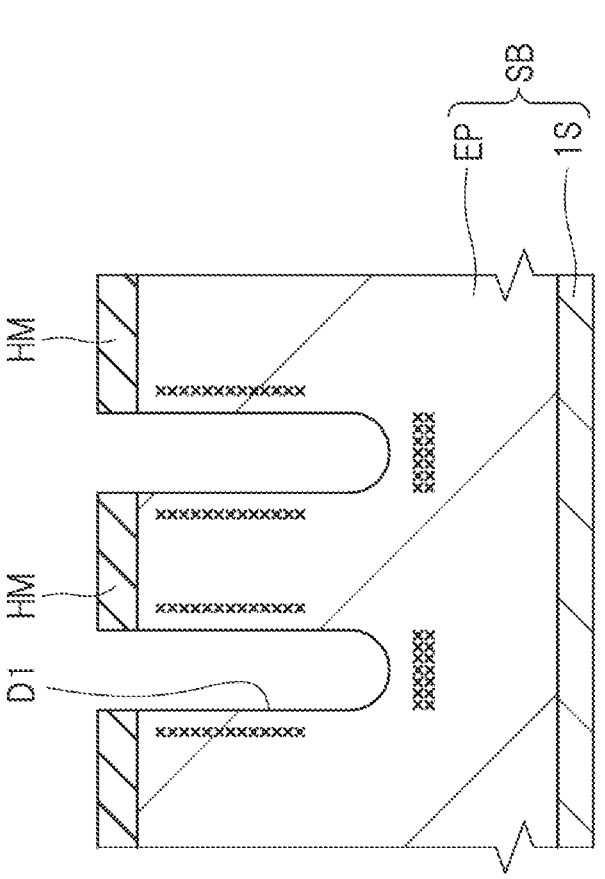
FIG. 20 is a cross-sectional view showing the manufacturing process of the semiconductor device according to the first modification of the one embodiment.

Also, even when oblique ion implantation is performed and p-type impurities and carbon are implanted into the side surface of the trench D1, the position at which carbon is introduced can be changed according to the angle and energy of the ion implantation. Regarding the oblique ion implantation process, FIG. 18 shows a case where the implantation energy is small, and FIG. 19 shows a case where the implantation energy is large. Further, as shown in FIG. 20, both ion implantation with an implantation angle of 0 degrees and oblique ion implantation may be performed.

Figure 21:
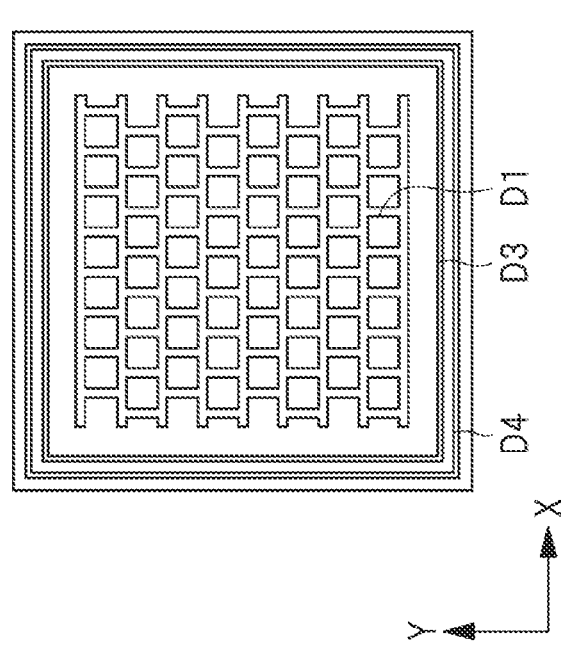
FIG. 21 is a schematic plan view showing a semiconductor device according to a second modification of the one embodiment.

In the first embodiment has been described with respect to the case where the arrangement of the gate electrode and the stripe shape, but is not limited thereto, for example, to place the gate electrode in a grid shape or mesh shape, it may be a so-called mesh shape. FIG. 21 shows a planar layout of a semiconductor chip that is a semiconductor device of a second modification. In FIG. 21, gate electrodes and field plate electrodes are formed along the shapes of the trench D1.

As shown in FIG. 21, the trench D1 is arranged in a mesh-like manner in a plan view. That is, an end portion of a plurality of grooves D1 extending in the X direction and extending in the Y direction and arranged in the X direction is connected to each of a plurality of grooves D1 arranged in the Y direction. A plurality of grooves D1 extending in the Y direction and arranged in the X direction are arranged in a plurality of rows in the Y direction, and the positions of the grooves D1 are shifted by half a period between adjacent rows in the Y direction. Since a plurality of groove D1 extending in the Y direction and adjacent to each other in the X direction extend in the Y direction and are connected to each other in the X direction, a plurality of groove D1 in the groove D3 integrally form a single mesh-like layout.

By forming the gate electrode in a mesh shape, the gate density can be improved, and thus the on-resistance can be further reduced. Further, since the gate resistance can be reduced, the switching loss can also be reduced.

Although the invention made by the present inventor has been specifically described based on the embodiment, the present invention is not limited to the as described above embodiment, and it is needless to say that various modifications can be made without departing from the gist thereof.

For example, an in-trench double-gate power MOSFET having a field plate electrode and a gate electrode in the trench has been described. On the other hand, even in the trench gate power MOSFET having only the gate electrode without the field plate electrode in the trench, the same advantages as those of the first embodiment can be obtained by introducing the p-type impurity and the carbon into the bottom of the trench.

What is claimed is:

1. A method of manufacturing a semiconductor device, the method comprising:

(a) preparing a semiconductor substrate of a first conductivity type;

(b) forming a plurality of grooves on a main surface of the semiconductor substrate;

(c) introducing a first impurity of a second conductivity type and carbon into a bottom surface of the plurality of grooves by ion implantation with an implantation angle of 0 degrees, thereby forming a first semiconductor region of the second conductivity type different from the first conductivity type in the semiconductor substrate under the bottom surface of the plurality of grooves;

(d) introducing a second impurity of the second conductivity type and carbon into a side surface of the plurality of grooves by oblique ion implantation, thereby forming a third semiconductor region of the second conductivity type in the semiconductor substrate at the side surface of the plurality of grooves;

(e) after the (c) and (d), forming a gate electrode inside the plurality of grooves via a first insulating film;

(f) after the (e), forming a second semiconductor region of the second conductivity type in the semiconductor substrate at a side surface of the plurality of grooves between the adjacent grooves, the second semiconductor region being used as a channel forming region; and (g) forming a source region of the first conductivity type in the semiconductor substrate from a main surface of the semiconductor substrate to the second semiconductor region, wherein a bottom of the semiconductor substrate is used as a drain region of the first conductivity type, and wherein the source region, the drain region, the gate electrode, and the first semiconductor region comprise a field effect transistor.

2. The method according to claim 1, wherein the (f) includes:

(f1) introducing impurities of the second conductivity type into the semiconductor substrate in contact with a side surface of the grooves, and (f2) after the (f1), forming the second semiconductor regions by performing a heat treatment to diffuse the impurities of the second conductivity type.

3. The method according to claim 1, wherein the first semiconductor region is formed by implanting the impurity of the second conductivity type and the carbon into the same region of the semiconductor substrate by ion implantations in the (c).

4. The method according to claim 1, further comprising a (e1) forming a first electrode in the plurality of grooves via a second insulating film prior to the formation of the gate electrode, wherein the (e) includes forming the gate electrode over the first electrode.

* * * * *